(12) United States Patent
Kirsten

(10) Patent No.: US 6,367,150 B1
(45) Date of Patent: Apr. 9, 2002

(54) SOLDER FLUX COMPATIBLE WITH FLIP-CHIP UNDERFILL MATERIAL

(75) Inventor: Kenneth J. Kirsten, Streamwood, IL (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 09/148,506

(22) Filed: Sep. 4, 1998

Related U.S. Application Data

(60) Provisional application No. 60/057,587, filed on Sep. 5, 1997.

(51) Int. Cl.$^7$ .................................................. H05K 3/34
(52) U.S. Cl. .................... 29/840; 29/841; 228/180.1; 228/180.21; 228/180.22; 228/214; 228/215; 156/182; 156/305; 156/330; 156/307.1; 156/331.1
(58) Field of Search ................ 29/840, 841; 228/180.1, 228/180.21, 180.22, 214, 215, 175; 264/494; 156/182, 305, 307.1, 330, 331.1

(56) References Cited

U.S. PATENT DOCUMENTS

| | | | |
|---|---|---|---|
| 3,449,641 | A | 6/1969 | Lee |
| 3,791,027 | A | 2/1974 | Angelo et al. |
| 4,999,699 | A | 3/1991 | Christie et al. |
| 5,128,746 | A | 7/1992 | Pennisi et al. |
| 5,250,843 | A | 10/1993 | Eichelberger |
| 5,250,848 | A | 10/1993 | Christie et al. |
| 5,376,403 | A | 12/1994 | Capote et al. |
| 5,439,164 | A | 8/1995 | Hasegawa et al. |

*Primary Examiner*—Valencia Martin-Wallace
*Assistant Examiner*—Binh-An D. Nguyen
(74) *Attorney, Agent, or Firm*—Ladas & Parry

(57) ABSTRACT

An epoxy-based soldering flux is used to solder a flip-chip IC device to a metallic bond site on a substrate material. The soldering flux is composed of a thermosetting epoxy resin and a cross-linking agent with inherent flux activity. When heated the cross-linking agent cleans the metal oxides from the metal surfaces on the chip and then reacts with the epoxy resin to form a thermosetting epoxy residue. The flux residue left on the board after soldering does not inhibit the flow of an underfill encapsulant. The underfill binds to the thermosetting residue of the flux which increases adhesion strength preventing delamination of the chip during thermal cycling.

11 Claims, No Drawings

SOLDER FLUX COMPATIBLE WITH FLIP-CHIP UNDERFILL MATERIAL

This application claims benefit of Provisional Appln. 60/057,587 filed Sep. 5, 1997.

FIELD OF THE INVENTION

The invention relates generally to interconnection and encapsulation of electronic components, in particular to interconnection and encapsulation methods for flip-chip integrated circuits, and specifically to material selection for interconnection and encapsulation of flip-chip integrated circuits.

BACKGROUND OF THE INVENTION

Thermosetting resin compositions such as epoxy resins have been used as semiconductor device encapsulants for over 25 years as noted by reference to U.S. Pat. No. 3,449,641, granted Jun. 10, 1969.

U.S. Pat. No. 3,791,027, Angelo et al., describes epoxy fluxes for soldering. Angelo et al. teach that the fluxes may be formulated to be removable from the solder situs or may be formulated through cross-linking after the soldering process to form a thermoset epoxy polymer which remains at the solder joint and reinforces the strength of the solder joint.

Anhydride-cured epoxy resin encapsulants used in flip-chip manufacturing methods that are applied after electrical interconnection are described in U.S. Pat. No. 4,999,699, granted Mar. 12, 1991, and U.S. Pat. No. 5,250,848, granted Oct. 5, 1993.

The flip-chip method of attaching integrated circuits to substrate boards involves a series of metal solder bumps on the integrated circuit which form metallurgical interconnections with the metal bond sites on the board substrate. The active side of the integrated circuit is flipped upside down in order to make contact between the bumps on the chip and the metal bond sites on the substrate. An organic soldering flux is used to remove metal oxides and promote wetting of the solder when the assembly is heated above the temperature of the solder. This process is referred to as reflow soldering. The purpose of the flux is to clean the surface of the metals. The solder, or lower melting alloy, may be the composition of the board bond pads, of the bumps on the chip or both depending on the materials selected. Similarly, the higher melting alloy may be present on either the bond pad or the bumps on the chip. This process is derived from the controlled, collapse, chip, connect (C4) method developed by IBM in the 1960's.

The reflow soldering operation provides a gap of 0.025 mm to 0.17 mm between the chip and the substrate. Although this small standoff height significantly enhances the electrical performance of the mounted flip-chip, the residue from the flux is difficult to remove from the narrow gap. Thus, no-clean fluxes, in which flux residues are not removed from the board after reflow soldering, are the flux type of choice for most flip-chip applications. These no-clean fluxes may be dispensed onto the metal bond sites on the board prior to chip placement. These liquid no-clean fluxes are formulated to contain more than 94% solvent which evaporates during the reflow process and flux activators which sublime during the reflow step. Thus, minimal amounts of residue remains on the board after reflow. These liquid fluxes, however, have difficulty in holding the chip to the board prior to reflow. The high solvent content of the flux causes the small integrated circuit to skew and misalign before peak soldering temperatures are reached. An additional problem arises from the volatility of many solvents used in these fluxes which blow the chips out of alignment during reflow. Although tackifying agents can be added to overcome these problems, the no-clean, low-residue requirement of the flux dictates a high solvent content which leads to alignment problems during reflow.

In order to maintain alignment of the chip to the board prior to reflow soldering, a viscous tacky flux may be applied to the bumps on the chip. This method involves dispensing the flux onto a rotating disk or drum then applying a blade above the rotating drum. Thus, a desired thickness of flux on the drum can be achieved by adjusting the height of the blade. The integrated circuit, containing solder bumps, is then dipped into the flux on the drum to a set depth. Using this method a desired amount of tacky flux is applied to the surface of the bumps only. The chip is then aligned and placed onto the substrate so that the bumps, which contain tacky flux, make contact with the appropriate metal bond sites. The tacky flux is formulated to contain a higher solids content which aids in the adhesion of the chip to the substrate prior to reflow. The tacky flux acts as a temporary glue to hold the chip in proper alignment during placement of the assembly into the reflow oven. The tacky flux contains less solvent which prevents the phenomenon of blowing the chips off the board during reflow commonly seen using liquid fluxes. Since only a small amount of flux is applied to the bumps, minimal residue remains on the board after soldering.

The tacky fluxes commonly used are the solderpaste flux vehicles used in no-clean surface mount processes. Although the formulations of no-clean solderpaste flux vehicles vary, a typical composition contains 50% rosin, 40% solvent, 5–8% thickeners, and 2–5% flux activators such as organic acids and amines. The rosin, or a synthetic resin with similar characteristics, does not boil-off during the reflow profile and is necessary to act as a carrier for flux agents at peak soldering temperatures. The residue which remains after soldering is typically rosin or a similar resin with any remaining ingredients such as decomposed organic acids, amines, thickeners, or other organic constituents of the solderpaste. When these solderpaste flux vehicles are used to solder flip-chip devices using the described drum flux method they provide desirable properties such as rolling on the drum, forming thin films and leaving minimal residue.

The flip-chip assembly is formed by soldering the solder bumps of the integrated circuit to the appropriate metal bond sites of the organic substrate. The resulting flip-chip assembly has a gap between the integrated circuit and substrate. This gap is generally filled with an underfill encapsulant. The liquid underfill encapsulant is dispensed around the sides of the soldered flip-chip and allowed to flow under the assembly by capillary action. The purpose of the encapsulant is to relieve the thermomechanical stresses on the solder interconnections that are caused by the difference in thermal expansion coefficients between the silicon IC (CTE=2.5 ppm/° C.) and the organic substrate (CTE=15–20 ppm/° C.). Typical underfill encapsulants used in flip-chip assemblies are composed of epoxy resins, curing agents and inorganic fillers to yield a cross-linked thermosetting polymer when cured. The properties of the cured polymer, such as the CTE and elastic modulus, help relieve the thermomechanical stress on the solder joints during thermal cycling testing. Thermal cycling tests involve repeated exposure of the flip-chip assemblies to cycles of cold and hot environments. This repeated cycling induces thermal fatigue on the solder joints as the chip and organic substrate expand at different rates. A typical thermal cycle test involves repeated exposure of the flip-chip assembly to two different liquids at −55° C. and +125° C. with 10 minute dwell time at each temperature. Thus, the overall purpose of the underfill encapsulant is to enhance flip-chip assembly reliability by relieving the thermomechanical stress on the solder joints. Flip-chip assemblies on inorganic substrates, such as ceramic, do not generally use an underfill encapsulant as the CTE of ceramic closely matches that of the silicon IC.

Several process and material property characteristics dictate the material selection of the underfill encapsulant. First, the epoxy underfill encapsulant must flow quickly under the chip to achieve fast production cycle times. The viscosity, surface tension and particle size distributions can be optimized to achieve efficient flow under the chip during the encapsulation step. To further reduce the underfill time the substrate may be heated in order to reduce the viscosity of the uncured epoxy material. This heating significantly enhances the flow speed of the material. It is common to heat the surface of the substrate board to 70° C. prior to dispense of the encapsulant in order to achieve this effect. Second, the epoxy underfill must cure quickly in order to achieve fast production cycle times. Typical underfill encapsulants are epoxy formulations designed to cure, i.e. form irreversible cross-linked structures, at temperatures above 150° C. Finally, the epoxy underfill encapsulant must adhere strongly to both the chip and substrate during thermal cycling tests. If the epoxy pulls away, or delaminates, from either the chip or substrate surface, proper stress relief on the interconnects will not be achieved. The interface between the chip and the underfill is critical for proper thermal cycle reliability enhancement. It has been found that the interaction between the no-clean flux residue and the epoxy underfill encapsulant is critical to achieve maximum adhesion and proper flip-chip reliability enhancement.

As discussed, typical solderpaste flux compositions used as tacky fluxes for flip-chip contain rosin or a similar resin. After reflow soldering, a residue of rosin and other organic constituents of the flux remain on the substrate. Although these no-clean residues are benign to the assembly in terms of their corrosivity, these residues have been seen to adversely affect the adhesion of the epoxy underfill encapsulant. These rosin residues can be reheated and softened or even liquefied. Rosin softens at 55° C. Since the underfill encapsulant is dispensed under the chip at temperatures of 70° C., the epoxy underfill comes in contact with a liquid or softened residue. During cure, at temperatures at or above 150° C., the epoxy is unable to properly adhere to the chip or substrate surface as the tacky flux residue is in a softened or liquefied state. The liquid or soft residue from the flux forms a barrier between the epoxy underfill and the surfaces of the chip and substrate. This may lead to early delamination from the chip surface poor adhesion of the underfill encapsulant.

This delamination of the encapsulant from the chip can be detected and measured using scanning acoustic microscopy (SAM). The SAM technique detects the presence of voids between the surface of the chip and the epoxy underfill. The SAM is used to first measure the total area of coverage then used to detect changes from this baseline value after thermal cycling tests.

SUMMARY OF THE INVENTION

In accordance with the present invention, there are provided tacky flux compositions for use in the soldering of flip-chip assemblies which contain in the most general terms 1.) an epoxy resin; 2.) a chemical cross-linking agent with fluxing properties; and 3.) a solvent. The tacky flux compositions of the present invention are also referred to herein as epoxy-based fluxes or epoxy-based fluxing agents. The compositions may be employed to solder flip-chip assemblies to substrates, such as organic substrates with high CTE values relative to the silicon IC, which require an underfill encapsulant to enhance reliability performance by reducing thermomechanical fatigue on the solder interconnects. The residue is present at minimum levels so as not to interfere with the underfill of the encapsulant, is designed to co-react with the underfill encapsulant and reduces delamination of the underfill from the substrate and chip during thermocycling reliability tests.

The present invention involves using an epoxy resin flux which does not interfere with solder melt and after the soldering step is partially cured to provide enhanced bonding at the interface of encapsulant and residue.

One aspect of the present invention relates to a protocol for selection of components for soldering flux for soldering flip-chip devices to circuit substrates, based on the ability of the solder flux components, when used in combination, (1) to provide adequate flux activity to clean the surface metal oxides for a variety of solder alloy and metal bond compositions;

(2) to provide latency during the selected solder reflow profile; and (3) to enhance bonding at the residue and underfill interface.

DETAILED DESCRIPTION OF THE INVENTION

The flux compositions of the present invention are comprised of (1) an epoxy resin; (2) a cross-linking agent for such resin, which also functions as a fluxing agent during reflow soldering; (3) one or a combination of solvents; and (4) optionally a catalyst. These components are selected to form, in combination, a composition which forms a stable bond site for the underfill encapsulant.

Thermosetting polymers with flux properties are described in U.S. Pat. No. 5,376,403 (Capote) the teaching of which is incorporated herein by reference thereto. In Capote, the thermosetting polymers serve as adhesives when used in combination with metal powders to form conductive inks. Thermosetting compositions with inherent flux properties are described in U.S. Pat. No. 3,791,027 (Angelo) the teaching of which is incorporated herein by reference thereto. The thermosetting resins of Angelo protect and reinforce the solder joints.

The requirement of the present invention of polymer reaction latency is described in U.S. patent application Ser. No. 08/644,912, entitled Encapsulant with Fluxing Properties and Method of Use in Flip-Chip Surface Mount Soldering, the teaching of which is incorporated herein by reference thereto. Thermosetting compositions described in Ser. No. 08/644,912, which function as soldering fluxes in surface mount soldering find particular utility as the soldering flux of the present invention which forms a thermosetting residue after solder reflow.

Epoxy flux systems, wherein a catalyst is utilized to provide required latency for soldering, may be used, provided that the residue, after fluxing, is compatible with the encapsulant and adequate bonding occurs at the interface of encapsulant and residue during co-curing.

The benefit of using a thermosetting flux composition called for in the present invention resides in such fluxes' compatibility with the underfill encapsulant. The method of selection of a (1) an epoxy resin, preferably an epoxy, (2) a cross-inking agent with fluxing properties, (3) one or more solvents and (4) optionally a catalyst, is based not only on the ability of the composition to serve as a flux and reduce metal oxides during soldering but also on the ability of the thermosetting resin residue to form a stable bond site for adhesion of the underfill encapsulant.

As described in U.S. patent application Ser. No. 08/644, 912, Encapsulant with Fluxing Properties and Method of Use in Flip-Chip Surface Mount Soldering, the teaching of which is incorporated herein by reference thereto, it is critical that encapsulant compositions which have fluxing properties remain in a liquid form at elevated temperatures below the melting point of the alloy used in the soldering operation. This is a critical feature of the flux used in the present invention. Indeed, the properties of successful encapsulants with fluxing properties that are useful in fluxing underfill compositions are those required for the flux of the present invention. If a thermosetting flux composition reacts to its gel point, at which point the composition is restricted from liquid flow, before the melting point of the alloy is reached the gelled polymer will inhibit the desired wetting of the soldering of the alloys of the interconnection. The gel point of the thermosetting polymer is reached when sufficient cross-linking takes place between the resin and cross-linking agent molecules to inhibit the flow characteristics of the polymer composition.

Once the gel point is reached, the reaction is irreversible and said composition cannot be reheated and remelted by definition of a thermosetting polymer. Although this thermosetting characteristic is essential to the present invention, it is critical that this gel point is reached only after proper solder interconnections are formed. The thermosetting flux compositions are therefore designed to provide latency and not reach a gel point until after solder interconnections are formed.

Although flip-chip on board applications typically use the surface-mount reflow profile described in detail in U.S. patent application Ser. No. 08/644,912, the use of the present invention is not limited to surface mount reflow soldering. There are a number of flip-chip applications which do not call for the staggered heating profile necessary in surface mount reflow soldering. The critical aspect of latency of cure is specific to the temperature profile used in the soldering process, the melting point of the solder alloy, and the mass of the epoxy flux composition. One aspect and objective of the present invention is to describe a method for selecting epoxy compositions which function as soldering fluxes that provide increased adhesion with an underfill encapsulant.

In accordance with one embodiment the present invention, an epoxy flux composition is dispensed onto a drum fluxer comprised of a rotating disk and a blade in order to form a thin film of said flux. Preferably the epoxy-based fluxing agent is applied in the form of a thin film of a thickness less than 10/1000 inch. A flip-chip device is dipped into the film of flux in order to apply a layer of said flux to the solder bumps on the chip. The chip is removed from the drum then placed on a substrate so the solder bumps make contact with the proper metal bond pads on the circuit substrate. The assembly is heated beyond the melting point of the solder alloy used, preferably, but not limited to a surface mount reflow profile, in order to form metallurgical connections between the flip-chip and the circuit substrate. After soldering, the circuit substrate is reheated, typically to 70° C. and an underfill encapsulant is dispensed between the chip and substrate. The flip-chip assembly is then heated, typically to 150–165° C., in order to cure the encapsulant material. During the dispense and cure stages of the underfill encapsulant, the flux residue used in soldering the flip-chip to the circuit substrate forms a stable bond site for the adhesion of the encapsulant.

In the above mentioned process the epoxy flux is applied to the bumps on the chip only. As the bumps on the chip are typically 0.025 to 0.125 mm high, it is estimated that only from about 3 to about 5 micrograms of said flux are deposited per bump depending on the height of the bump. Since the cure kinetics of a thermosetting polymer are dependent on mass, it is important to consider the thin-film cure properties of said flux when used in the process described. Therefore, a thin film of material will reach a gel point at a much faster rate than a large mass of the same material under the same cure conditions. Although several compositions are described in prior art in which a thermosetting polymer exhibiting flux action is used to promote solder wetting, compositions must be selected on their ability to provide latency as a thin film when used in the chip dipping flux application process.

The selection of components to be used in combination to serve as a flux as well as a non-melting adhesion site for underfill encapsulation is based on the overall characteristics of the formulation to 1.) provide adequate flux activity to clean the surface metal oxides for the solder alloy and metal bond compositions; 2.) provide latency during the selected solder reflow profile; and 3.) to enhance bonding at the residue and underfill interface.

In U.S. Pat. No. 3,791,027 (Angelo) the teaching of which is incorporated herein by reference thereto, thermosetting polymers are described which function as flux agents. Specifically, chemicals containing amide, amino, carboxyl, imino, or mercaptan functional groups which contain active hydrogen, which functions to reduce surface metal oxides, and are also capable of "cross-linking" when reacted with appropriate resin functionalities such as epoxide, isocyanate, etc. to form thermosetting residues. In the present invention, polymer precursors, such as acid anhydrides, carboxy terminated polybutadiene, or amines, which contain one or more of the above noted chemical functionalities, have been tested and identified to promote adequate solder wetting at 360° F.–550° F. using 63Sn/37Pb solder to copper.

In applications of flip-chip soldering, solder bumps on the chip or the metal bond sites on the pads may be composed of various metallurgies. A common flip-chip/substrate combination is 5Sn/95Pb (m.p.=301–304° C.) bumps and 63Sn/37Pb (m.p.=183° C.). Also, copper substrates often contain an organic solder preservative, commonly known as OSP, such as a benzimidazole, in order to protect the copper from oxidation. The OSP coated copper or the high lead alloys are more difficult to wet by 63Sn/37Pb solder alloy than copper and therefore require stronger flux agents in order to promote proper solder wetting.

In U.S. Pat. No. 5,376,403 (Capote), the teaching of which is incorporated herein by reference thereto examples of curing agents are described which function to reduce surface metal oxides on powders in electrically conductive ink applications. Specifically, a method is suggested to chemically protect an anhydride cross-linking agent by reacting said anhydride with an alcohol or polyol to form a mono-ester acid. More specifically, the reaction product from a combination of anhydride and a polyol is identified and selected as a suitable component to function as a metal reducing agent only when chemically triggered at high temperatures and react with an appropriate resin to adhere said ink to the substrate. Finally, the esterified product from the reaction of the anhydride with the polyol significantly improved the reduction of surface metal oxidation over the neat anhydride as evidenced by increased electrical conductivity of conductive inks made in this manner.

Thus, reactions of an anhydride with an alcohol or polyol are seen to increase the ability of the anhydride to reduce metal oxides, hence increasing the flux activity. The esterified anhydride contains more active hydrogen sites for reduction of surface oxides than the neat anhydride. Also, the esterified anhydride is said to be chemically protected which delays the reaction of said esterified anhydride cross-linking agent with the resin thereby preventing premature hardening of the polymer below the melt point of the solder alloy used. This delayed reaction is critical to thermosetting fluxes which are useful to form the soldering flux of the present invention which forms a thermosetting residue after solder reflow for flip chip applications as the small mass of flux used rapidly increases the curing process. Therefore, esterified anhydrides, i.e. the reaction products between anhydrides and alcohols or polyols, are the cross-linking agents of choice for flip-chip flux compositions which leave thermosetting residues.

EXAMPLE I
Thermosetting Flux Formulation with Catalyst

A thermosetting flux composition was prepared empirically to obtain a composition which could easily be printed to a thin film according to the following formula:

| Component | Wt. % |
|---|---|
| Shell Epon 815 (diglycidyl ether of bis phenol A and butyl glycidyl ether blend) | 38 |
| Esterified anhydride (reaction product of methyl tetrahydro-phthalic anhydride with glycerol) | 42 |
| Diethylene glycol dibutyl ether | 20 |

The composition was dispensed onto a drum fluxer composed of a rotating disk and a blade in order to form a thin film of said flux. A flip-chip device was dipped into the film of flux in order to apply a layer of said flux to the 63 Sn/37 Pb solder bumps on the chip. The chip was removed from the drum then placed on a substrate so the solder bumps made contact with the proper copper bond pads on the circuit substrate. The assembly was heated beyond the melting point (183° C.) of the solder alloy in a typical surface mount reflow profile. The profile consisted of a ramp at 2° C./sec. to 150° C. followed by a 90 sec. dwell time between 150–170° C. then a quick ramp to 215° C. This system formed proper metallurgical interconnections. A standard epoxy flip-chip underfill encapsulant was dispensed under the gap formed between the chip and the circuit substrate at 70° C. The thermosetting residue from the flux did not impede the flow of the encapsulant as underfill times for the encapsulant were consistent with those with traditional rosin flux residues.

Flip-chip assemblies were built using a standard rosin-based tacky flux and the tacky flux described in the present invention. They were both then underfilled using a standard anhydride cured epoxy underfilled, comprising cycloaliphatic epoxy resin, anhydride curing agent, catalyst, miscellaneous additives and filler, with the bulk comprising filler. Assemblies were submitted to liquid/liquid thermocycling conditions from −55° C. to 125° C. then examined using scanning acoustic microscopy to check for the degree of delamination. Flip-chip assemblies built using fluxes of the present invention showed a lower degree of encapsulant delamination from the silicon chips than assemblies built using a standard rosin solderpaste flux after 1000 thermocycles. It is believed that the reduction in delamination is due to the increased compatibility and adhesion provided by the thermosetting flux residue of the invention.

A preferred flux of the present invention comprises (1) thermosetting resin, preferably an epoxy resin, (2) a cross-linking agent for such resin, which also functions as a fluxing agent during reflow soldering, and, (3) if necessary, a solvent, which functions to modify (lower) viscosity and to reduce the solid content of the flux; thereby reducing the amount of residue remaining after soldering. The components of the flux are selected and combined to form, in combination, a composition having a gel point temperature at or above the soldering temperature whereby surface soldering is not inhibited by gelling prior to soldering when using a surface mount temperature profile. As used herein, gel point temperature is the temperature for the involved thermosetting resin system where, after initiation of catalyzed cross-linking, the gel point is reached. Simply stated, the process of the present invention will not produce a satisfactory electrical connection if, prior to solder melt, which occurs at the solder melt temperature, the gel point of the involved epoxy resin system is reached.

In thermosetting epoxy fluxes of the present invention, the sequencing of stages of cross-linking vis-a-vis reflow soldering is critical.

It is essential that the gel point of the system not be reached prior to formation of the connection by liquid solder (solder melt), which connection occurs at surface mount reflow solder temperature.

Where the gel point is reached before melting of the solder, the solder does not wet and does not effectively engage the opposing loci to be electrically connected because solder flow is restricted.

It is believed that the criticality of this requirement derives from the inability of the solder to flow in a resin system where the gel point has been reached.

In choosing the category of encapsulants described in U.S. patent application Ser. No. 08/644,912 for use as the soldering flux of the present invention, selection of thermosetting resin and cross-linking agents is critical in order to enable satisfactory electrical and mechanical bonding at the electrical bond sites to take place. The encapsulant requirements and selections are discussed below.

During the reflow profile, the polymer must not reach its gel point before solder melt, since the molten solder must displace the polymer in order to wet the bonding surface. If the polymer reaches its gel point too quickly, a polymer barrier is formed between the metal surfaces. Since this gelation inhibits the solder from wetting the substrate metal bond pad, it is critical to understand the curing mechanism and kinetics of the polymer in order to understand the effect on soldering.

In thermoset polymers, the addition of heat initiates the irreversible reaction between the epoxy resin and the cross-linking agent. During the cure process the epoxy resin molecules react with the cross-linking molecules to form long polymer chains and networks with increasing viscosity. As the network grows, a point of infinite viscosity is reached called the gel point. At this point the polymer changes from a viscous liquid to a solid that does not flow.

The gel time of thermosetting resins is usually found under isothermal conditions. For example, epoxy samples can be heated at a set temperature and tested using viscosimetric methods to find the gel time. An example of such a method is to heat epoxy resins in sample pans while measuring resistance to flow.

Where electrical interconnection of flip-chip assemblies is effected under typical surface mount profiles, slow heating of the flip-chip assembly to soldering temperatures is involved and it is important to estimate the gelation of the polymer by examining the cure kinetics.

Several techniques can be used to examine cure kinetics of the thermoset polymers comprising the thermosetting flux. One such method is dynamic mechanical analysis (DMA), which measures the polymer's ability to store and dissipate mechanical energy. Another common technique is to use differential scanning calorimetry (DSC), which measures changes in heat.

As the chemical reaction of thermoset resins during polymerization is exothermic, this change in heat can be measured using DSC and related to the extent of chemical reaction. As described by Hadad in *Epoxy Resins, Chemistry and Technology,* May, ed., Marcel Dekker, 1988, p. 1130, "an assumption is made that the amount of energy given off during the cure is proportional to the extent of chemical reaction." Using techniques described by Hadad it is possible to estimate the kinetic activation energy required for initiation of polymerization. One such method involves generating DSC scans using different heating rates as described in ASTM Method E 698-79. However, since the critical gelation point in order to prevent proper soldering interference as described in this invention must be determined empirically, DSC will be shown to serve only as a guide for proper material combinations as the soldering process has previously been described as ranges. Therefore, a single DSC scan at a single heating rate is used to show the relationship between cure kinetics of thermosetting polymers and their applicability for use in the method of soldering described in this invention.

Additional components may be included in the epoxy flux, such as catalyst, surfactive agents, solvents, co-solvents, viscosity-enhancing agents and the like, provided that they do not adversely affect encapsulant adhesion.

A component which can optionally and advantageously be included in the fluxes of the present invention is a surface tension reducing agent. It is used to reduce the contact angle at the bonding surfaces. The surface tension reducing agent may be a surfactant. Among the suitable surfactants are TWEEN®, available from ICI, Wilmington, Del., and potassium perfluoroalkyl sulfonates. When present, the surface tension reducing additive is preferably added in amounts of from about 0.1 weight % to about 1 weight % based on the total weight of catalyst-containing flux.

An example of another component that optionally is added to the flux compositions of the present invention is an adhesion promoter which has the ability to enhance epoxy to metal bonding. Suitable adhesion promoters include organo silanes and titanates. A suitable organosilane is 6040, 3-glycidoxy-propyltrimethoxysilane available from Dow Corning Corp. of Midland, Mich. A suitable titanate is LICA 38, neopentyl (diallyl)oxy, tri(diooctyl)pyrophosphatotitinate available from Kenrich Petro Chemicals, Inc., in Bayonne, N.J. The adhesion promoter is preferably added in amounts of from about 0.1 weight % to about 1% weight % based on the total weight of the flux.

In accordance with one aspect of the present invention, after reflow soldering, the epoxy residue is solid in form at room temperature; however, it has been observed and is part of the preferred embodiment of the present invention that the residue liquifies at the temperature of encapsulant dispense and underfill. The selection of this temperature is well known in the art, typically, a temperature of about 70° C. is used. After underfill is completed, the temperature is raised to effect co-cure of residue and encapsulant.

As noted herein, flux and encapsulant selection to achieve the required properties of each including compatibility and in the preferred embodiment of the present invention, co-cure of flux and encapsulant is an important aspect of the method of flip-chip production in accordance with the present invention. These features and other elements involved in the present invention are discussed below.

1. Flux Selection

In order to remove metal oxides and promote solder wetting, during electrical interconnection of component and substrate in flip-chip production, a reducing agent, commonly known as a fluxing agent, must be added to a flux system. The reducing agents commonly used are carboxyl acids (—COOH) and amines (—NH$_x$). A variety of carboxylic acids and amines are commonly used among liquid and solderpaste fluxes. Another common component of flux, rosin, typically composed of monofunctional abietic acid and derivatives thereof, also serves as a flux agent during soldering. When a rosin-based flux is used in a soldering operation, the residue of rosin left on the board has the advantage of serving as an electrical insulator. In flip-chip applications, where the soldering operation is followed by encapsulation with an epoxy compound, rosin residue is, however, undesirable since such residue reduces the adhesion of the epoxy. That is, the rosin based flux residue is not compatible with the epoxy underfill. It is believed that the rosin is incompatible because the monofunctional acid architecture does not enable bonding with encapsulant during cure.

In accordance with the present invention, an epoxy-based flux, as opposed to a rosin-based flux, is used to leave a residue that is compatible with the epoxy underfill material of the present invention to thereby promote the adhesion of the underfill. If epoxy functional groups are left on the board after a soldering operation, they provide a suitable bond site for the binding of the epoxy underfill and lead to better adhesion. Epoxy compounds, however, do not contain functional groups that promote solder wetting. Epoxy compounds are not suitable fluxing agents when used alone. Epoxy-based fluxes of the present invention must contain a suitable fluxing agent in order to promote the wetting of the solder. When selecting a suitable fluxing agent to be used with the epoxy resin to provide a suitable flux for use in the present invention, several points must be considered. It is critical that the fluxing agent and epoxy resin not react to the point of a gel before the solder joints are formed.

1. Solderability—The flux agent or agents, when used in combination with the epoxy resin or resins, must be active enough in the dosage used to promote adequate wetting of the solder for the given application.
2. Latency—The flux agent selected, when used in combination with one or more epoxy resins, must not prematurely react with the resin before the melting point of the solder. Most common fluxing agents, or compounds which contain suitable metal oxide reducing functionalities, are often also common epoxy resin curing agents. If the epoxy-based flux reacts or reaches a gel point before the melting point of the solder, a polymer barrier will be formed which will interfere with the proper wetting of the solder. Thus, a suitable system must be latent.
3. Compatibility—The flux agent, when used in combination with one or more epoxy resins, must be compatible with the epoxy used after the soldering step. In the case of flip-chip applications, typical epoxy systems used as underfills are anhydride cured systems. The epoxy based flux should adhere well, and in the preferred embodiment of the invention, co-cure with the underfill encapsulant. The flux reside is only partially cured, whereby bonding/cross-linking at the interface of flux residue and encapsulant occurs during encapsulant cure, thereby enhancing bonding of residue and encapsulant.

1. Required Properties of Flux

The primary property of the flux is that it contain functional groups, preferably —COOH, that reduces metal oxides and promote solder wetting. A second consideration of the flux is that it contain epoxy resin functionalities in order to be compatible with the underfill. Third, the chemicals responsible for flux activity (which, in the present invention, function also as cross-linking agent) should be reactive with epoxy resins from either the flux or the underfill. The cross-linking agent, in combination with the epoxy resins, should maintain latency and not inhibit solder wetting.

2. Selection of Underfill and the Required Properties Thereof

The underfills of interest in the present invention are the commercially available epoxy-based underfills. These contain epoxy resins, anhydride curing agents such as methylhexahydrophthalic anhydride, silica filler, and a catalyst. These ingredients, when used in combination, provide a material with a Tg above 150° C., and a CTE lower than 25 ppm/° C. when cured. These materials have a pot-life above 8 hours. They are generally dispensed onto substrates that are heated to 50° C. to 70° C. in order to reduce the viscosity of the underfill in order to promote fast flow under the integrated circuit that is to be encapsulated. After flowing under the IC, the underfill is cured using convection heating at 150–160° C. for 30 or more minutes. The purpose of the underfill is to enhance the reliability of the solder joints on the flip-chip during repeated temperature cycling. Although there are several other polymer options such as silicones or urethanes, epoxy-based underfills are the most widely used in flip-chip applications and the underfill/encapsulant of choice in the present invention.

The epoxy underfill encapsulants of the present invention includes anhydride cured epoxy underfill. The anhydride cured epoxy underfill may be an underfill wherein the epoxy is a cycloaliphatic epoxy.

3. Compatibility of Flux and Underfill

Compatibility can be viewed in three separate categories: cleaning, underfill, and co-cure. First, the flux residues from standard rosin-based fluxes may need to be cleaned in order to inhibit corrosion, promote flow of the underfill, or increase adhesion of the underfill. Cleaning the residues is difficult, however, as the gap between the flip-chip and the substrate is generally 0.05–0.15 mm. The cleaning operation is both time-consuming and difficult. A compatible flux would not need to be cleaned from the board prior to dispense of the underfill. Second, as the flux residues will not be cleaned, they should not impede the flow of the underfill under the flip-chip. Excessive flux residue would impede the flow of the underfill. The addition of a solvent, which vaporizes during the soldering step, lowers the final amount of residue left on the surface after soldering. Less residue on the board interferes with the underfill to a lower extent. Finally, the flux formulas of the present invention, contain epoxy resins and common epoxy curing agents which serve as flux agents. Non-compatible fluxes contain rosin or other ingredients which inhibit the adhesion of the underfill. The highest level of compatibility is achieved between fluxes and underfills where they are able to co-cure during the curing step following underfill.

4. Parameters of the Soldering Step

The soldering step relates specifically to a Sn/Pb soldering alloy such as 63Sn/97Pb, or a similar alloy, with a melting point near 183° C. Originally, flip-chip processes on ceramic substrates involved high melting point (>300° C.) alloys such as 3Sn/97Pb. The flux formulas of the current invention would not promote soldering at these high temperatures as they would reach a gel point or decompose. Instead, the flux formulations are designed to be used in a reflow soldering operation which is generally used for solderpaste. The solder paste reflow profile using 63Sn/37 Pb alloy typically involves a ramp step to a temperature of 150° C., a soak step in which the components and substrate are brought to thermal equilibrium at 150–180° C., and a spike step to 210–220° C.-well above the solder melt point. The function of the flux during the reflow process is to clean the metal surface oxides from the solder and the bond pads which promotes wetting of the liquid solder to bonding metal surface. Thus, to allow proper wetting of the solder during reflow, the epoxy-based flux must clean/reduce the metal oxides and be displaced by the liquid solder as it wets the bonding metal surface.

5. Parameters of the Underfill Step

The underfill step is performed by a dispense robot. Generally, the surface of the substrate is heated to 50° C.–70° C. in order to reduce the viscosity of the underfill thereby increasing the flow speed of the underfill. The underfill is dispensed through a needle around one or two sides of the chip. Capillary action, pulls the underfill into the gap between the chip and the substrate. Heating the board increases this effect. Rosin-based flux residues left on the surface melt at this temperature and are believed to be displaced by the flow front of the underfill and forced to the interface between the chip and the underfill. The main failure mechanism of flip-chips is the delamination of the chip from the epoxy underfill. Evidence suggests that rosin is present in this interface when a rosin-based flux is used.

6. Theoretical Explanation of Flux/Underfill Advantages

It is believed that, since epoxy functional groups are present in both the flux and the underfill, a co-reaction takes place between the flux and the underfill at their interface. This is thought to lead to enhanced adhesion between the chip and substrate thereby preventing delamination of the chip from the underfill.

7. Evidence of the Advantages

Scanning Acoustic Microscopy (SAM) can be used to measure the amount of delamination between the chip and the underfill. This technique was used on assemblies that were subjected to repeated temperature cycling tests, which accelerates the failure rate of the solder joints. The test showed that assemblies built with said epoxy-based flux showed a lower degree of delamination than boards assembled with traditional fluxes. Cleaning the residues of the board prior to underfill does however decrease the delamination rate. The advantage of the epoxy-based fluxes is not having to clean the residue from the board prior to underfill.

The invention is further illustrated by reference to the studies conducted with reference to the feature identified below.

Solderability Study

All fluxes in the study, fluxes #1–#8 perform well as fluxes for soldering. The test involved dispensing a set volume of flux between a 63Sn/37Pb solder slug placed on a copper substrate. The assembly was then placed in an in-line soldering oven using a typical surface-mount reflow profile. All fluxes performed adequately in removing metal oxides and promoting the wetting of the solder to the copper. Little distinction is seen in the amount of spread of the solder between epoxy based fluxes although a rosin based flux did show better performance.

Epoxy Based Flux- Polyester Cure Flux #1

| Chemical | Wt % |
| --- | --- |
| Epon 815 | 38 |
| Polyester Curing Agent | 42 |
| Diethylene Glycol Dibutyl Ether | 10 |

Epoxy-Based Fluxes- Amine Type

| Chemical | Flux #2 | Flux #3 | Flux #4 | Flux #5 | Flux #6 | Flux #7 |
| --- | --- | --- | --- | --- | --- | --- |
| MY722 | | | | | 5 parts | |
| MY720 | 5 parts | 3 parts | 3 parts | | | |
| UC 4221E | | 2 parts | 2 parts | | | 5 parts |
| Epon 828 | | | | 5 parts | | |
| DEA | | | 1 part | | | |
| TEA | 1 part | 1 part | | 1 part | 1 part | 1 part |

Rosin-Based Flux—Flux #8
Kester SP244 C
Latency Study

Although fluxes #1–7 are based on epoxy resin, flux #1, contains a polyester curing agent while fluxes #2–#7 are based on amines. In order to be an effective flux, an epoxy-based formulation must not cure or gel before the melting point (183° C.) is reached. As epoxies are thermosetting polymers, heat initiates the irreversible reaction of the epoxy resin with the curing agent.

Using differential scanning calorimetry, the onset temperature of the reactions were found to differ between the fluxes. Twenty milligrams of each flux sample was dispensed into aluminum DSC crucibles. Each crucible was heated from 30° C. to 200° C. at 10° C./min. The latency of the system was distinguished as the onset temperature of the exotherm, as well as the relative height, which indicates the amount of energy, of the exotherm. DSC graphs indicate that fluxes #2–#7 have greater latency than flux #1. In addition, it is seen that TEA (triethanol amine) seems to be more latent than DEA.(diethanol amine) as seen by the lower peak exotherm for flux #3 vs. flux #4.

The advantages achieved in accordance with the present invention are identified and illustrated below.

Example of the Advantages

Flip-Chip assemblies were built by dipping the bumps of the chip into a film of flux, aligning the bumps on the chip to the bond pads on the substrate, then soldering the chip in an in-line reflow oven. Next, an underfill epoxy encapsulant was dispensed into the gap formed between the chip and the substrate and cured using convection heating. Next the assemblies were subjected to thermal cycling tests from −65° C. to 125° C. until failure of the parts was detected.

After the thermocycling tests, cross-sections of the assemblies were taken in order to analyze the source of failure. The cross-sections are taken in order to view the interfaces between the board and the epoxy underfill as well as the interface between the chip and the epoxy underfill. The results depend on the type of flux used.

Rosin-based Solderpaste Type Flux—No Cleaning

When a rosin-based, solderpaste type flux is used to solder the flip-chips and the flux residue is not removed from the gap between the chip and the board, cross-sections after thermal cycling tests reveal that the epoxy underfill delaminates, or no longer adheres to the chip or the board. Therefore, the method of failure is a delamination of the epoxy underfill from both the board and chip. In addition, a layer of flux can be seen on the surface of the board.

Rosin-based Solderpaste Type Flux—Cleaning

If the flux residue from a rosin-based solderpaste type flux is removed from the gap between the chip and the board, cross-sections after thermal cycling tests reveal the epoxy underfill delaminates only from the interface with the chip. However, cleaning the flux residue from the gap is difficult and time consuming. It can be done using an appropriate solvent followed by baking dry the assemblies.

Epoxy-based Flux—No Cleaning

An epoxy-based flux, as described in the present invention, was used to solder the flip-chip assemblies. Cross-sections after thermal cycling tests revealed that the epoxy underfill delaminated only from its interface with the chip. The interface with the board was intact. The epoxy-based flux formed a small meniscus on the board surface surrounding the solder joints. The interface between this flux residue and the epoxy underfill was apparent due to the barrier of filler particles as only the underfill contained silica filler particles.

Comparison of Flux Systems

Underfilled flip-chip assemblies were prepared using a rosin-based flux where the residue remained, a rosin-based flux in which the residue was removed and using the epoxy-based flux of Example I, which, in accordance with the present invention, was not removed.

All assemblies were subjected to liquid—liquid thermocycling tests from 65° C. to 125° C. as well as SAM testing, Early failures and delamination were observed in assemblies in which the rosin residue remained on the board. Significantly higher numbers of thermocycles and reduced delamination was observed when the rosin-residue had been removed and in boards using the flux of Example I. This indicates that the Example I epoxy-based flux reside provides improved adhesion versus the rosin residue.

It is not intended to limit the present invention to the particular embodiments described herein, and various modifications may be made, including, but not limited to, changes based on variations in the solder and hence solder melt temperature and conditions of solder melt, the dimensions, shape and materials, without departing from the scope and spirit of the invention as set forth in the following claims.

I claim:

1. A method of electrically connecting an electrical component having a plurality of spaced apart electrical component electrical terminations to a substrate having a plurality of spaced apart substrate electrical terminations corresponding to the terminations of said electrical component to form a plurality of spaced apart electrical connections and then interfilling said electrical and substrate components with an encapsulant composition sandwiched therebetween to encase said spaced apart electrical connections comprising:

a) forming spaced apart electrical connections of said spaced apart component electrical terminations to said corresponding spaced apart substrate electrical terminations with solder at reflow soldering temperature utilizing an epoxy-based fluxing agent that leaves an epoxy-based fluxing agent residue that is partially cured on said spaced apart electrical connections and leaves open space between the spaced apart electrical connections with epoxy-based fluxing agent residue thereon;

b) filling said open space between said spaced apart electrical connections with partially cured epoxy-based fluxing agent residue thereon with an epoxy underfill encapsulant that co-cures with the epoxy-based fluxing agent residue; and then c) co-curing said epoxy underfill encapsulant and epoxy-based fluxing agent residue to form a bond at the interface of said epoxy based underfill encapsulant and epoxy-based fluxing agent residue.

2. The method of claim 1, wherein the epoxy-based fluxing agent comprises an epoxy resin and a cross-linking agent which, when used in combination, provide a level of flux activity to clean the surface metal oxides of the solder used to form said electrical connections and to provide latency during a preselected solder reflow profile.

3. The method of claim 2, wherein the epoxy-based fluxing agent further comprises a catalyst for catalyzing cross-linking of said epoxy resin with said cross-linking agent, the peak exotherm of said mixture of catalyst, thermosetting resin, and cross-linking agent as measured using differential scanning calorimetry at a ramp rate of 10° C. per minute being at or above the solder melting point whereby the gel point of said epoxy-based fluxing agent is reached after solder melt.

4. The method of claim 3, wherein the cross-linking agent is an esterified anhydride.

5. The method of claim 1, wherein the epoxy-based fluxing agent is comprised of a diglycidyl ether of bisphenol A.

6. The method of claim 5, wherein the epoxy underfill encapsulant is an anhydride cured epoxy underfill.

7. The method of claim 1 wherein the epoxy-based fluxing agent residue liquifies at dispense and underfill temperature used to fill the open space between spaced apart electrical connections having epoxy-based fluxing agent residue thereon with epoxy-based underfill encapsulant.

8. The method of claim 1, wherein the epoxy-based fluxing agent further comprises a solvent.

9. The method of claim 8, wherein the epoxy-based fluxing agent further comprises an adhesion promoter.

10. The method of claim 1, wherein the epoxy-based fluxing agent is applied in the form of a thin film of a thickness less than 10/1000 inch.

11. The method of claim 1, wherein the epoxy underfill encapsulant is an anhydride cured epoxy underfill.

* * * * *

UNITED STATES PATENT AND TRADEMARK OFFICE
CERTIFICATE OF CORRECTION

PATENT NO.    : 6,367,150 B1
DATED         : April 9, 2002
INVENTOR(S)   : Kenneth J. Kirsten It is certified that error appears in the above-identified patent and that said Letters Patent is hereby corrected as shown below:

<u>Title page,</u>
Item [73], change the Assignee from: "Northrop Grumman Corporation, Los Angeles, CA (US)" to -- Litton Systems, Inc., Los Angeles, CA (US) --

Signed and Sealed this

Twenty-seventh Day of August, 2002

Attest:

Attesting Officer

JAMES E. ROGAN
*Director of the United States Patent and Trademark Office*